United States Patent [19]
Weigert et al.

[11] Patent Number: 5,480,531
[45] Date of Patent: Jan. 2, 1996

[54] TARGET FOR CATHODE SPUTTERING AND METHOD OF ITS PRODUCTION

[75] Inventors: Martin Weigert, Hanau; Uwe Konietzka, Rodenbach, both of Germany; Bruce Gehman, Morgan Hill, Calif.

[73] Assignee: Degussa Aktiengesellschaft, Frankfurt am Main, Germany

[21] Appl. No.: 106,986

[22] Filed: Aug. 16, 1993

Related U.S. Application Data

[63] Continuation-in-part of Ser. No. 915,238, Jul. 20, 1992, abandoned.

[30] Foreign Application Priority Data

Jul. 24, 1991 [DE] Germany .......................... 41 24 471.0

[51] Int. Cl.$^6$ .......................... C04B 35/457; C23C 14/08
[52] U.S. Cl. .................. 204/298.13; 501/126; 501/134; 264/56
[58] Field of Search .................. 204/192.29, 298.13; 501/126, 134; 264/56, 570

[56] References Cited

U.S. PATENT DOCUMENTS

| | | | |
|---|---|---|---|
| 4,647,548 | 3/1987 | Klein | 204/298.13 |
| 5,071,800 | 12/1991 | Iwamoto et al. | 204/298.13 |
| 5,094,787 | 3/1992 | Nakajima et al. | 204/298.13 |
| 5,401,701 | 3/1995 | Ogama et al. | 501/134 |

FOREIGN PATENT DOCUMENTS 0386932  12/1990  European Pat. Off. .

*Primary Examiner*—R. Bruce Breneman
*Assistant Examiner*—Rodney G. McDonald
*Attorney, Agent, or Firm*—Beveridge, DeGrandi, Weilacher & Young

[57] ABSTRACT

Oxide-ceramic targets of partially reduced indium oxide-tin oxide mixtures are described. The targets provide high sputter performances, and they exhibit an essentially defined degree of reduction between 0.02 and 0.3, a density between 75 and 98% of the theoretical density and a specific electric resistance between $89 \times 10^{-3}$ and $0.25 \times 10^{-3}$ $\Omega \cdot cm$. The degree of reduction must not deviate at any point on the target surface by more than 5% from the average degree of reduction of the target. The targets are produced by means of hot-pressing the oxide mixtures which were partially reduced beforehand in a special method step.

4 Claims, No Drawings

TARGET FOR CATHODE SPUTTERING AND METHOD OF ITS PRODUCTION

RELATED APPLICATION DATA

This application is a continuation in part of U.S. patent application Ser. No. 07/915,238, filed Jul. 20, 1992, now abandoned which application is entirely incorporated herein by reference.

INTRODUCTION BACKGROUND

The present invention relates to an oxide-ceramic target for cathode sputtering consisting of partially reduced indium oxide-tin oxide mixtures and to a method of producing these targets by means of hot-pressing.

Oxide-ceramic targets of indium oxide-tin oxide are used for producing transparent, electrically conductive, thin layers by means of cathode sputtering. Such layers are used in particular in liquid crystal display technology and in flat panel display technology. The thin layers of indium oxide-tin oxide can be produced either by sputtering metallic targets in an oxygen-reactive atmosphere or by means of sputtering oxide-ceramic targets. The sputtering process with oxide-ceramic targets has the advantage that the regulating of the sputtering process is simplified because the oxygen flow, or flux, in the sputtering chamber is only slight, compared to the high oxygen flows necessary when sputtering with metallic targets.

In order to achieve the lowest possible specific electrical resistances in the thin layer of indium oxide-tin oxide and to make high sputter performances possible, partially reduced indium oxide-tin oxide targets are preferably used.

The oxygen content is reduced in these targets in comparison to the stoichiometric oxides. These targets exhibit better electric and thermal conductivities and can be compressed to greater densities.

German OLS 33 00 525 teaches partially reduced indium oxide-tin oxide targets and their production. This document is entirely incorporated herein by reference. According to this publication, indium oxide-tin oxide powder mixtures are hot-pressed under reducing conditions at 850° to 1000° C.; the oxides are hot-pressed in a graphite hot-press mould or by means of the addition of carbon or organic material liberating carbon. The oxides are partially reduced during the hot-pressing procedure, so that a target is created that is depleted in its oxygen content in comparison to the stoichiometric composition.

A disadvantage of this method is the fact that a predeterminable precise maintenance of a certain oxygen stoichiometry can not be achieved on account of the reduction conditions during the pressing. Moreover, targets are obtained which exhibit, with a specific electric resistance of 0.1 to 0.6 $\Omega \bullet cm$, a relatively poor electric conductivity, which is negative for the sputter performance which can be achieved.

EP patent 0,386,932 teaches a target of indium oxide-tin oxide which exhibits, as a consequence of a primary particle size of 0.01 to 1 μm and a BET surface of the particles of 15 to 50 $m^2/g$, a density of more than 75% of the theoretical density and a specific electric resistance of $2 \times 10^{-3}$ to $2 \times 10^{-4}$ $\Omega \bullet cm$. This document also is entirely incorporated herein by reference.

The process preferably takes place in air but can also occur in inert gas or in a vacuum. In the latter instances, a non-defined deficit of oxygen is obtained in the target material. No optimum sputter performances can be achieved with such targets.

SUMMARY OF THE INVENTION

An object of the invention is to provide an oxide-ceramic target for cathode sputtering consisting essentially of partially reduced indium oxide-tin oxide mixtures with a density of more than 75% of the theoretical density and a specific electric resistance in the range of $89 \times 10^{-3}$ and $0.25 \times 10^{-3}$ $\Omega \bullet cm$ (inclusive) with which a high sputter performance can be achieved.

Another object of the invention is to provide a method of producing such targets.

In attaining the above and other objects, one feature of the invention resides in targets that exhibit an essentially uniform, defined degree of reduction of 0.02 to 0.30 which does not deviate at any position on the target surface by more than 5% from the average degree of reduction of the target and that the degree of reduction is defined as the difference in weight between the stoichiometric oxide mixture and the partially reduced oxide mixture divided by the difference in weight between the stoichiometric oxide mixture and the completely reduced metallic mixture.

Such targets with defined, uniform degrees of reduction of the indium oxide-tin oxide material exhibit surprisingly high sputter performances and thus permit short coating times.

As a further advantage, the indium-tin oxide targets in accordance with the invention have a low specific electrical resistance, in the range of $89 \times 10^{-3}$ to $0.25 \times 10^{-3}$ $\Omega \bullet cm$. Producing targets with low electrical resistivity is advantageous for several reasons. Because sputtering takes place in a co-current process, the delivery of charged particles to the target surface is very important. This may create surfaces which produce "arcing" during the process. But, if an indium-tin oxide target is provided with the lowest possible electrical resistance, the probability of arcing is minimized. Targets with very low electrical resistance have high performance characteristics, capable of performing at high sputter rates, without disturbing the coating properties through undesirable arcing.

Furthermore, according to the Wiedemann-Franz law, thermal conductivity is proportional to electrical conductivity of a material. Because of this, targets with good electrical conductivity also process high thermal conductivity. Therefore, one skilled in the art would expect that a surface of a target material having high electrical and thermal conductivity (i.e., low electrical resistivity) also would warm up less at a given power density than a material having a lower electrical and thermal conductivity. The higher the temperature of the target, the greater the likelihood that the relatively fragile indium-tin oxide target material will be damaged by cracking. Thus, by producing a indium - tin target material having a lower electrical resistivity (i.e., higher electrical and thermal conductivity), the target can be loaded with a higher power density.

Additionally, a lower target resistance allows the sputtering process to be operated at a lower cathode potential. Those skilled in the art will recognize that indium-tin oxide coatings have good conductivity when they are produced at a lower cathode potential. Thus, lower target resistance leads to a better coating conductivity.

DETAILED DESCRIPTION OF THE INVENTION

Targets with the necessary properties are produced by means of hot-pressing partially reduced indium oxide-tin oxide mixtures, starting with indium oxide-tin oxide mixtures which exhibit an essentially defined, uniform degree of reduction between 0.02 and 0.30; the hot-pressing takes place under inert protective gas and the moulds consist essentially of inert non-reducing material or are jacketed with such a material.

The indium oxide-tin oxide mixture is preferably subjected prior to the hot-pressing to an annealing at 300 to 800° C. in a reducing gaseous atmosphere until a defined, selectable degree of reduction between 0.02 and 0.3 has been obtained.

Likewise, the indium oxide-tin oxide mixture can be mixed with a solid powder with a reducing action and annealed, i.e., heated, at 600° to 1000° C. in an atmosphere of inert gas.

Hydrogen, carbon monoxide, hydrogen-argon mixtures or hydrogen-nitrogen mixtures are used, for example, as reducing gaseous atmospheres and carbon powder, for example, as a reducing solid.

The adjustment of a defined degree of reduction is achieved during the reducing treatment of the stoichiometric $In_2O_3/SnO_2$ mixtures by means of annealing in reducing gaseous atmospheres or by means of annealing while admixing reducing solid matter before the hot-pressing. The degree of reduction previously adjusted remains preserved during the subsequent hot-pressing process under inert conditions, that is, e.g., under an atmosphere of argon protective gas and while using protective jacketings of the moulds or of the press cans, so that the targets exhibit defined degrees of reduction of 0.02 to 0.30. It surprisingly turns out that very high densities (up to 98% of the theoretical density) can be achieved by means of the reduction treatment before the hot-pressing both in uniaxial and in isotropic hot-pressing. One is, however, free to set any densities desired between 75% and 98% of the theoretical density by means of an appropriate controlling of the hot-pressing process.

The specific electric resistances of the target material are very low and specific resistances between $89 \times 10^{-3}$ and $0.25 \times 10^{-3}$ $\Omega \bullet cm$ are found, depending on the degree of reduction and of hot-pressing.

The following examples are intended to explain the targets of the invention and their production in more detail.

EXAMPLES

Example 1

A mixture of 900 g indium oxide and 100 g tin oxide was uniformly mixed with 0.05 g carbon powder. The mixture was annealed 1 hour at 800° C. under an atmosphere of argon. After the annealing, the mixture had a weight of 996.45 g, corresponding to a degree of reduction of 0.021. 216 g of the reduced powder mixture were filled into a graphite hot-pressing mould 80 mm in diameter and jacketed with boron nitride and pressed at 850° C. under an atmosphere of argon in such a manner that a final thickness of 8 mm was achieved.

The maximum contact pressure was 18.5 MPa. The compacted target disk has a density of 5.37 g/cm³, corresponding to 75% of the theoretical density. The specific electric resistance of the target material was $89 \times 10^{-3}$ $\Omega \bullet cm$.

Example 2

A mixture of 900 g indium oxide and 100 g tin oxide was uniformly mixed with 5 g carbon powder. The mixture was annealed 1 hour at 1000° C. under an atmosphere of argon. After the annealing, the mixture had a weight of 953.90 g, corresponding to a degree of reduction of 0.26. 600 g of the reduced powder mixture were prepressed in a cold isostatic manner with a pressure of 200 MPa. The green compact was fitted into a cylindrical press can of 0.5 mm thick VA steel jacketed on the interior with binder-free $Al_2O_3$ paper. The press can was evacuated to a vacuum of $3 \times 10^{-3}$ mbars and welded shut. The can was then pressed in an isostatic hot press at 850° C. for 2 hours at 200 MPa pressure. After removal from the jacket, the indium oxide-tin oxide body had a size of approximately 88 mm in diameter and 14 mm in height. A precise density measurement according to the buoyancy method yielded a density of 7.03 g/cm³, corresponding to a density of 98% of the theoretical density. The specific electric resistance of the target material was $1.2 \times 10^{-3}$ $\Omega \bullet cm$.

Example 3

A mixture of 900 g indium oxide and 100 g tin oxide was annealed 1 hour at 700° C. under an atmosphere of $H_2/N_2$ (20/80). After the annealing, the mixture exhibited a weight of 975.20 g, corresponding to a degree of reduction of 0.14. 280 g of the mixture were filled into a graphite hot-pressing mould 80 mm in diameter jacketed with boron nitride. The mixture was pressed at 850° C. and a maximum pressure of 25 MPa in such a manner that a maximum density was achieved.

The compacted target disk had a diameter of 80 mm and a height of 8.3 mm and exhibited a density of 6.71 g/cm³, corresponding to 94% of the theoretical density. The specific electric resistance of the target material was $3.1 \times 10^{-3}$ $\Omega \bullet cm$.

Example 4

A mixture of 950 g indium oxide and 50 g tin oxide was annealed 1 hour at 450° C. under an atmosphere of $H_2$. After the annealing, the mixture exhibited a weight of 965.06 g, corresponding to a degree of reduction of 0.2. 280 g of the mixture were filled into a graphite hot-pressing mould 80 mm in diameter jacketed with boron nitride. The mixture was pressed at 850° C. and a maximum pressure of 25 MPa under an atmosphere of argon in such a manner that a maximum density was achieved. The compacted target disk had a diameter of 80 mm and a height of 8.1 mm and exhibited a density of 6.88 g/cm³, corresponding to 96% of the theoretical density. The specific electric resistance of the target material was $2.1 \times 10^{-3}$ $\Omega \bullet cm$.

Example 5

A mixture of 2520 g indium oxide and 280 g tin oxide was annealed 1 hour at 700° C under an atmosphere of $H_2/N_2$ (20/80). After the annealing, the mixture exhibited a weight of 2730.5 g, corresponding to a degree of reduction of 0.14. The mixture was filled into a graphite hot-pressing mould 203×203 mm in size jacketed with boron nitride. The mixture was then pressed at 850° C. and a maximum pressure of 24 MPa in such a manner that a maximum density was achieved. The compacted indium-tin oxide target disk had a size of 203×203 mm and a thickness of 10 mm. The target material exhibited a density of 6.62 g/cm³, corresponding to 92% of the theoretical density. 5 specimens were taken from the hot-pressed target material, 4 specimens from the 4 corners of the plate and one specimen from the middle of the plate. Each of the specimens had a weight of approximately 170 g.

The test pieces were completely reduced to metallic InSn alloy by means of reduction annealings in a current of $H_2$ (1 hour at 800° C.). The degree of reduction was checked over the entire target surface from the difference in weight between the original test piece and the completely reduced InSn alloy.

The measurements showed:

|  | Degree of reduction |
| --- | --- |
| Specimen corner 1 | 0.142 |
| Specimen corner 2 | 0.141 |
| Specimen corner 3 | 0.139 |
| Specimen corner 4 | 0.145 |
| Specimen middle | 0.144 |

The deviation of the degree of reduction over the named target surface is therefore less than 5% from the average degree of reduction.

Example 6

A mixture of 22302 grams indium oxide and 2478 grams tin oxide was annealed for two hours at 900° C. in a carbon crucible which was positioned in a closed muffle furnace. After the annealing, the mixture exhibited a weight of 24340 grams, corresponding to a degree of reduction of 0.10. The reduced powder mixture was prepressed in a cold isostatic manner with a pressure of 200 MPa resulting in a rectangular quader. The green compact was fitted into a rectangular press can of 0.5 mm thick VA steel, jacketed on the interior with binder free $Al_2O_3$ paper. The press can was evacuated to a vacuum of $5\times10^{-2}$ mbar and welded shut. The can was then pressed in an isostatic hot press at 850° C. for two hours at 200 MPa pressure. After removal from the jacket, the indium oxide-tin oxide body had a size of approximately 352×90×110 mm.

A precise density measurement according to the buoyancy method yielded a density of 6.98, corresponding to 97.5% of the theoretical density. The body was sawed and ground to flat target plates. The specific electrical resistance of the target material was $0.25\times10^{-3}$ Ω•cm.

Further variations and modifications of the foregoing will be apparent to those skilled in the art and are intended to be encompassed by the claims appended hereto.

We claim:

1. An oxide-ceramic target for cathode sputtering consisting essentially of a partially reduced indium oxide-tin oxide mixture which exhibits a density of more than 75% of the theoretical density and a specific electric resistance in the range of $89\times10^{-3}$ to $0.25\times10^{-3}$ Ω•cm, and which exhibits an essentially uniform, defined degree of reduction of 0.02 to 0.30 which does not deviate at any position on the target surface by more than 5% from an average degree of reduction of the target, wherein the degree of reduction is defined as the difference in weight between the stoichiometric oxide mixture and the partially reduced oxide mixture divided by the difference in weight between the stoichiometric oxide mixture and the completely reduced metallic mixture.

2. A method of producing an oxide-ceramic target, comprising: hot-pressing a partially reduced indium oxide-tin oxide mixture in a mould, which mixture exhibits an essentially defined, uniform degree of reduction between 0.02 and 0.30, the hot-pressing taking place under inert protective gas and the mould consists essentially of inert non-reducing material or is jacketed with said inert material, to thereby produce an oxide-ceramic target consisting essentially of a partially reduced indium oxide-tin oxide mixture which exhibits a density of more than 75% of the theoretical density and a specific electric resistance in the range of $89\times10^{-3}$ to $0.25\times10^{-3}$ Ω•cm, and wherein the target exhibits an essentially uniform, defined degree of reduction of 0.02 to 0.30 which does not deviate at any position on the target surface by more than 5% from an average degree of reduction of the target, wherein the degree of reduction is defined as the difference in weight between the stoichiometric oxide mixture and the partially reduced oxide mixture divided by the difference in weight between the stoichiometric oxide mixture and the completely reduced metallic mixture.

3. The method according to claim 2, wherein prior to hot-pressing, the indium oxide-tin oxide mixture is subjected to an annealing at 300° to 800° C. in a reducing gaseous atmosphere until the defined, uniform degree of reduction between 0.02 and 0.3 is obtained.

4. The method according to claim 2, wherein prior to hot-pressing, the indium oxide-tin oxide mixture is mixed with a solid powder with a reducing action and annealed at 600° to 1000° C. in an atmosphere of inert gas.

* * * * *